United States Patent
Chang

(10) Patent No.: US 7,258,318 B2
(45) Date of Patent: Aug. 21, 2007

(54) ROTARY-RELEASING DEVICE FOR POWER SUPPLY

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 376 days.

(21) Appl. No.: 10/902,037

(22) Filed: Jul. 30, 2004

(65) Prior Publication Data

US 2005/0205738 A1  Sep. 22, 2005

(30) Foreign Application Priority Data

Mar. 19, 2004  (TW) .............................. 93204152 U

(51) Int. Cl.
*A47F 5/00*  (2006.01)
*H01R 13/62*  (2006.01)

(52) U.S. Cl. .................. 248/310; 439/157; 439/476.1; 439/500

(58) Field of Classification Search ................ 439/157, 439/159, 160, 476, 477–479, 350, 500; 429/95–100; 607/2–7; 248/310, 309.1, 311.2, 220.21, 248/221.11, 222.11–222.14
See application file for complete search history.

(56) References Cited

U.S. PATENT DOCUMENTS

| | | | | |
|---|---|---|---|---|
| 2,987,693 A | * | 6/1961 | Wamsley | .................... 439/157 |
| 3,836,938 A | * | 9/1974 | Barrett et al. | ................ 439/157 |
| 4,515,872 A | * | 5/1985 | Okano | .......................... 429/65 |
| 5,224,870 A | * | 7/1993 | Weaver et al. | .............. 439/157 |
| 5,504,991 A | * | 4/1996 | Parmley, Sr. | ................. 29/825 |
| 5,868,790 A | * | 2/1999 | Vincent et al. | ................. 607/5 |
| 5,980,309 A | * | 11/1999 | Frantz et al. | ................ 439/500 |
| 6,806,681 B1 | * | 10/2004 | Cheiky et al. | .............. 320/107 |
| 6,917,183 B2 | * | 7/2005 | Barlev et al. | ................ 320/112 |
| 2005/0205738 A1 | * | 9/2005 | Chang | ........................ 248/310 |

* cited by examiner

*Primary Examiner*—Carl D. Friedman
*Assistant Examiner*—Tan Le
(74) *Attorney, Agent, or Firm*—Troxell Law Office, PLLC

(57) ABSTRACT

A rotary-releasing device for a power supply having two rotary arms arranged on one side thereof, and each rotary arm being coupled with the power supply by an axle end. The rotary-releasing device having: a latch bracket section, and a handle section. The latch bracket section is a suspending arm with a pressing surface, and a fixed end is coupled to a free end selected from one of the two rotary arms. The handle section has: a rotary axle body extending to a predefined height along a direction; a lifting handle extending from the rotary axle body, capable of receiving a force to enable handle section to perform a rotating movement using said direction as an axis; and a pressing arm extending from said rotary axle body to a predefined distance and connected to the lifting handle at a predefined angle.

3 Claims, 4 Drawing Sheets

ROTARY-RELEASING DEVICE FOR POWER SUPPLY

FIELD OF THE INVENTION

The present invention relates to a releasing device for power supply, and more particularly, to a rotary-releasing device capable of detaching a power supply by rotating a handle.

BACKGROUND OF THE INVENTION

As the advance of science and technology, the electronic technology also improves accordingly such that electronic products become an essential part of our daily life. In this regard, the power supply for supplying electric power to electronic products has become extraordinarily important. The common detachable power supply sold in the market is mounted onto the housing of the electronic product by a fixing device. The installation of such power supply is relatively troublesome because it needs a tool such as a screwdriver to install or remove the power supply. The screws may be damaged easily after in use for a period of time that the power supply will be stuck in the housing while the power supply is damaged or busted and is required to be removed from the housing. Under the circumstance, the whole electronic product is useless and will need to be replaced by a new one, and thus causes unnecessary waste and loss.

Please refer to FIG. 1 for the perspective view of a conventional power supply sold in the market. The detachable power supply 1 is disposed in a housing 7, and the housing 7 comprises an opening 71 corresponding to a connecting member 72 disposed on another side of the opening 71. The detachable power supply 1 comprises a power supply body 11, a fixed handle 12, two protruded lugs 13 and a connector 14. By applying a parallel force to the fixed handle 12, the power supply body 11 will be inserted into the housing 7 along the extended direction of a guiding track 73 through the opening 71, such that the connector 14 and the connecting member 72 are electrically connected. In addition, the two protruded lugs 13 are fixed onto the housing 7 to securing the power supply 1 and finishing the installation. However, the housing 7 and the power supply body 11 sometimes cannot cannot align with each other precisely owing to the mismatch between the two that the connector 14 and the connecting member 72 can not joint properly and are damaged due to the collision.

Since the aforementioned power supply 1 needs screws for securing the same onto the housing, such arrangement not only time consuming (since it can not be detached directly) and troublesome (since it is not easy to orient the power supply into the intended position), but also fixed handle 12 takes up lots of space. Further, it is required to apply only a parallel force to remove the detachable power supply 1, that is inconvenience and also increases the manufacturing cost. Thus, the way for overcoming the foregoing drawbacks deserves immediate attention.

SUMMARY OF THE INVENTION

It is therefore a primary object of the present invention to provide a rotary-releasing device for power supply, which is capable of facilitating the access convenience and minimizing the force required for installing/detaching the power supply by rotating and pulling a handle of the rotary-release device.

The secondary object of the present invention is to provide a strength-saving device for installing/detaching a power supply, which a prestress is provided to the handle of the device for achieving the effects of keeping the handle still or resuming the handle to its initial position.

To achieve the foregoing objectives, the present invention provides a rotary-releasing device for power supply, which comprises a latch bracket section and a handle section. The latch bracket section comprises a pressing surface and the pressing surface has an end as a fixing end of a suspending arm assembly.

The handle section comprises an axle body, a lifting handle and a pressing arm. The axle body extends along a direction to an appropriate height, and the lifting handle extends from the axle body to an appropriate length, such that a force can be applied to the lifting handle to rotate the lifting handle with respect to the extending direction of the axle body, and the pressing arm extends from the axle to an appropriate distance and is connected with the lifting handle by an appropriate angle. The pressing arm further comprises a first contact member and a second contact member extended therefrom.

If the lifting handle is at a first position, a side of the top surface of the first contact member presses against the pressing surface, and a side of the top surface of the second contact member is an appropriate distance away from the pressing surface. If a force is applied to the lifting handle to set the lifting handle to a second position, then the side of the top surface of the second contact member will press against the pressing surface.

To achieve the foregoing objectives, the present invention provides another preferred embodiment of the rotary-releasing device for a power supply. Two rotary arms are disposed on one side of the power supply, where each rotary arm is pivotally connected to the power supply by an axle end. The rotary-releasing device for the power supply comprises a latch bracket section and a handle section.

The latch bracket section is a suspending arm structure having a pressing surface, wherein a fixed end of the latch bracket section is pivotally connected to a free end selected from one of the two rotary arms.

The handle section further comprises an axle body, a lifting handle and a pressing arm. The axle body extends along a direction to an appropriate height and the lifting handle extends from the axle body to an appropriate length, such that a force can be applied to the lifting handle to rotate the lifting handle with respect to the extending direction of the axle body. The pressing arm extends from the axle to an appropriate distance and is connected with the lifting handle by an appropriate angle. The pressing arm further comprises a first contact member and a second contact member extended therefrom.

In the preferred embodiment of the present invention, the latch bracket section further comprises a hook member arranged at a free end of the bracket section and a connecting member disposed on a side of the bracket section at position corresponding to the hook member. If the handle section is at the first position, a side of the top surface of the first contact member presses against the pressing surface, and a side of the top surface of the second contact member is at an appropriate distance away from the pressing surface. The hook member and the connecting member are interconnected with each other. If a force is applied to the lifting handle to set the lifting handle to a second position, the side of the top surface of the second contact member presses the pressing surface to separate the hook member from the connecting member.

To make it easier for our examiner to understand the objective of the invention, its structure, innovative features, and performance, we use a preferred embodiment together with the attached drawings for the detailed description of the invention.

DESCRIPTION OF THE PREFERRED EMBODIMENT

Figure 1:
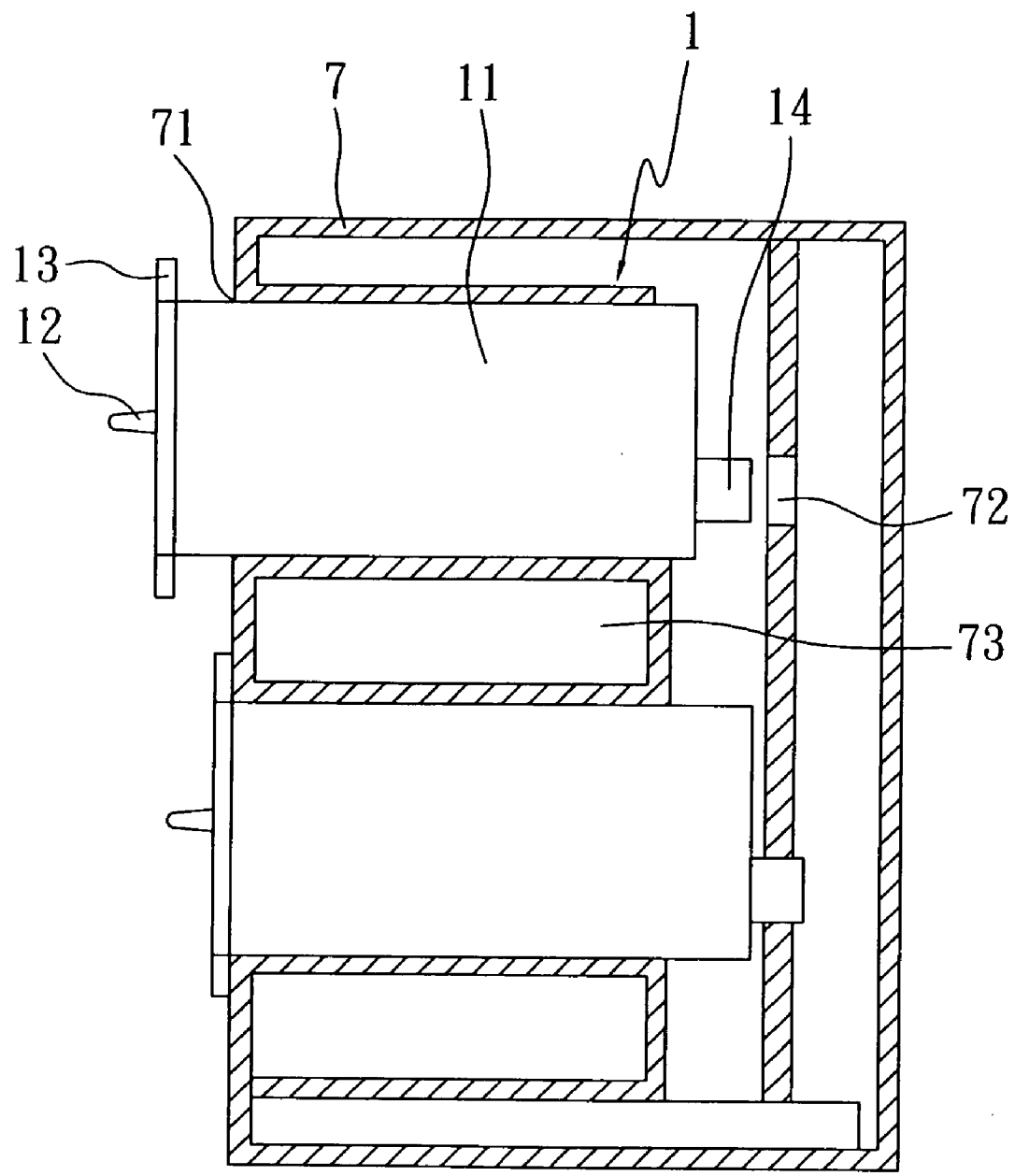
FIG. 1 is a side view of a conventional power supply.
Figure 2:
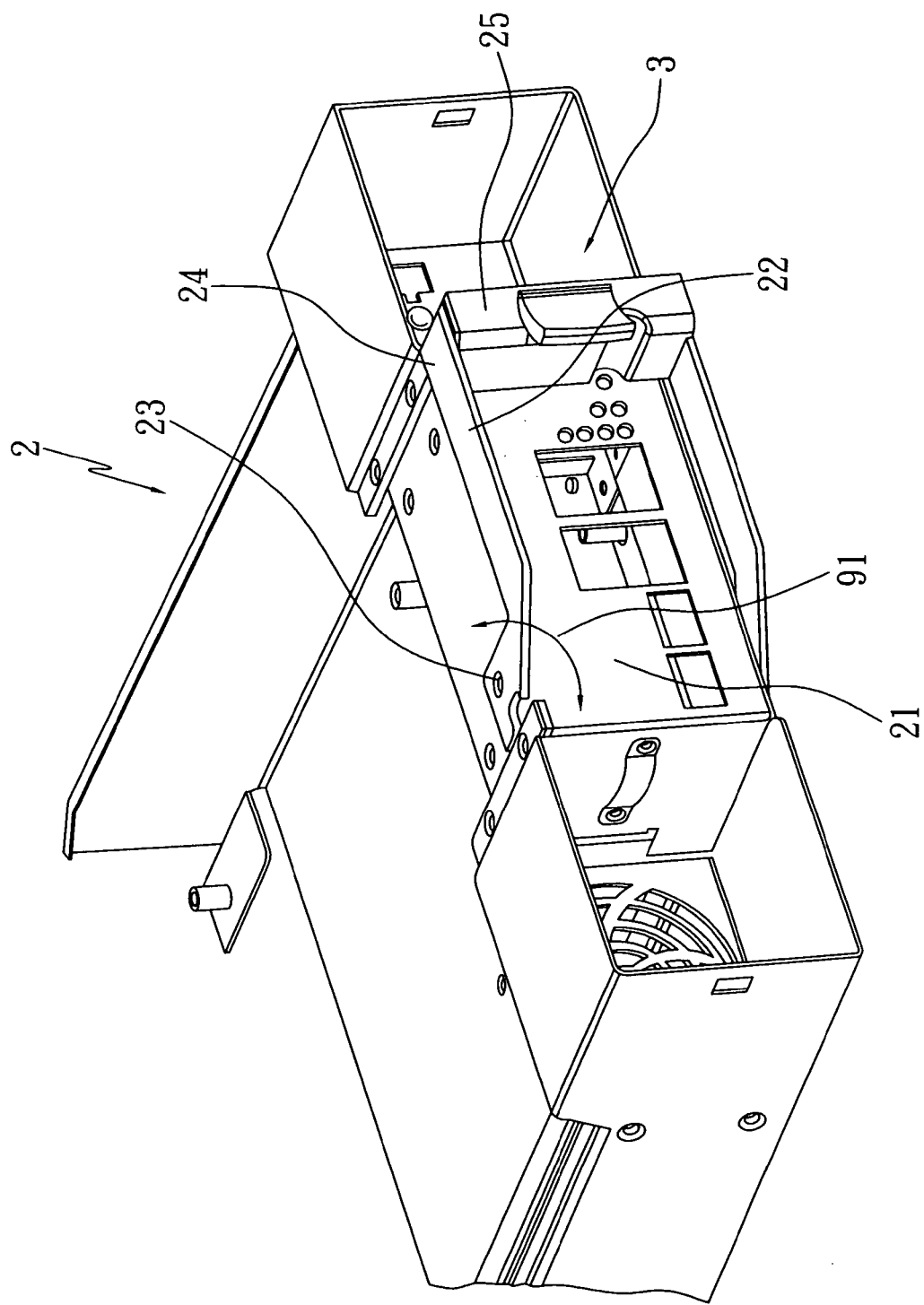
FIG. 2 is a perspective view showing the configuring structure of a rotary-releasing device for power supply and a power supply according to the present invention.

Please refer to FIG. 2, which a perspective view showing the configuring structure of a rotary-releasing device for power supply and a power supply according to the present invention. The power supply 2 is a rectangular block structure having a lateral side 21, wherein both the top and the bottom of the lateral side 21 are respectively equipped with a rotary arm 22. Each rotary arm 22 is pivotally connected to the power supply 2 by an axle end 23 to form a suspending arm structure, and the two free ends 24 of the two rotary arms 22 are connected to a handle device 25. The handle device 25 and the two rotary arms 22 can be rotated simultaneously using the axle end 23 as the axis to perform a rotating movement 91.

Figure 3A:
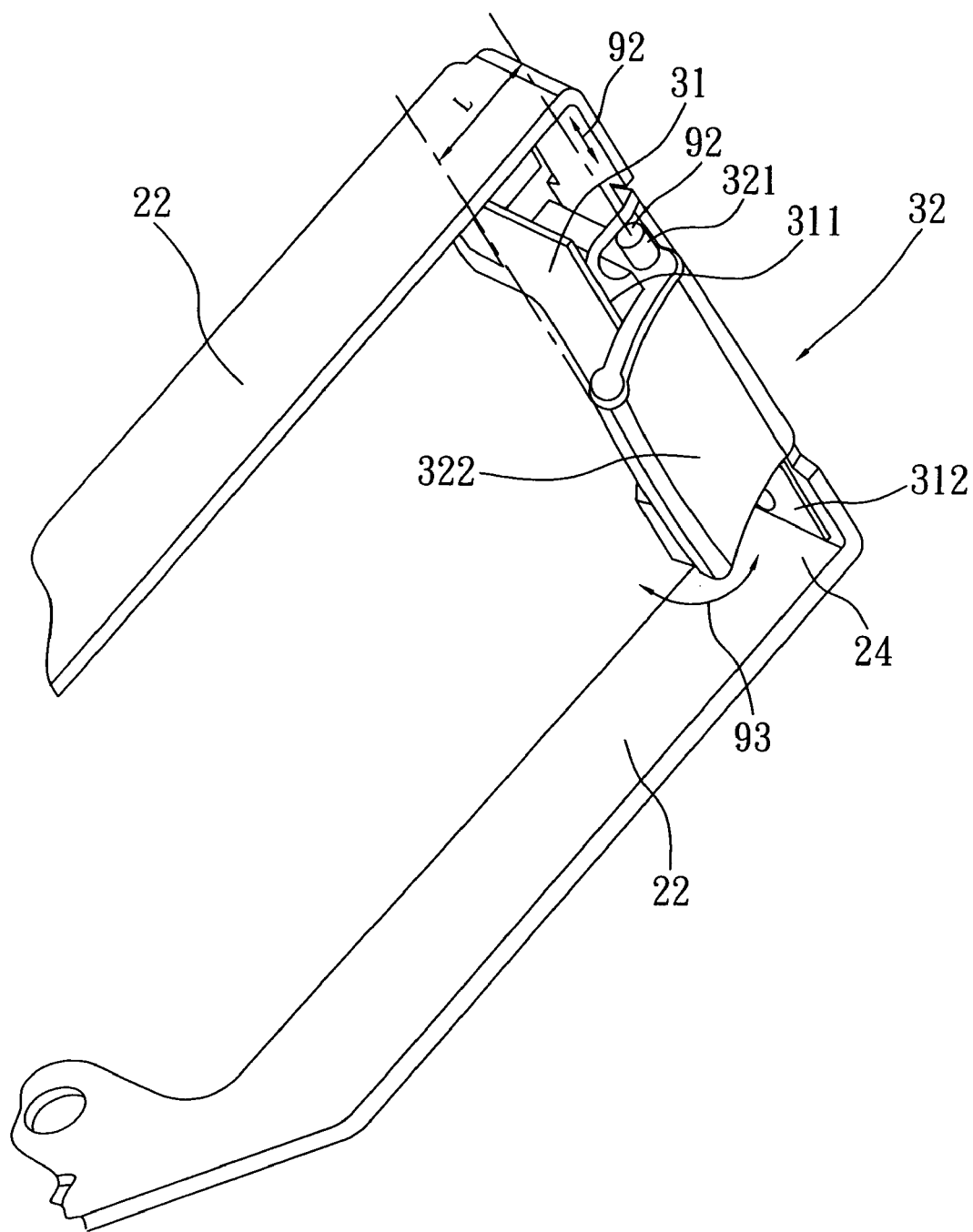
FIG. 3A is a perspective view of the rotary-releasing device for power supply according to the present invention.
Figure 3B:
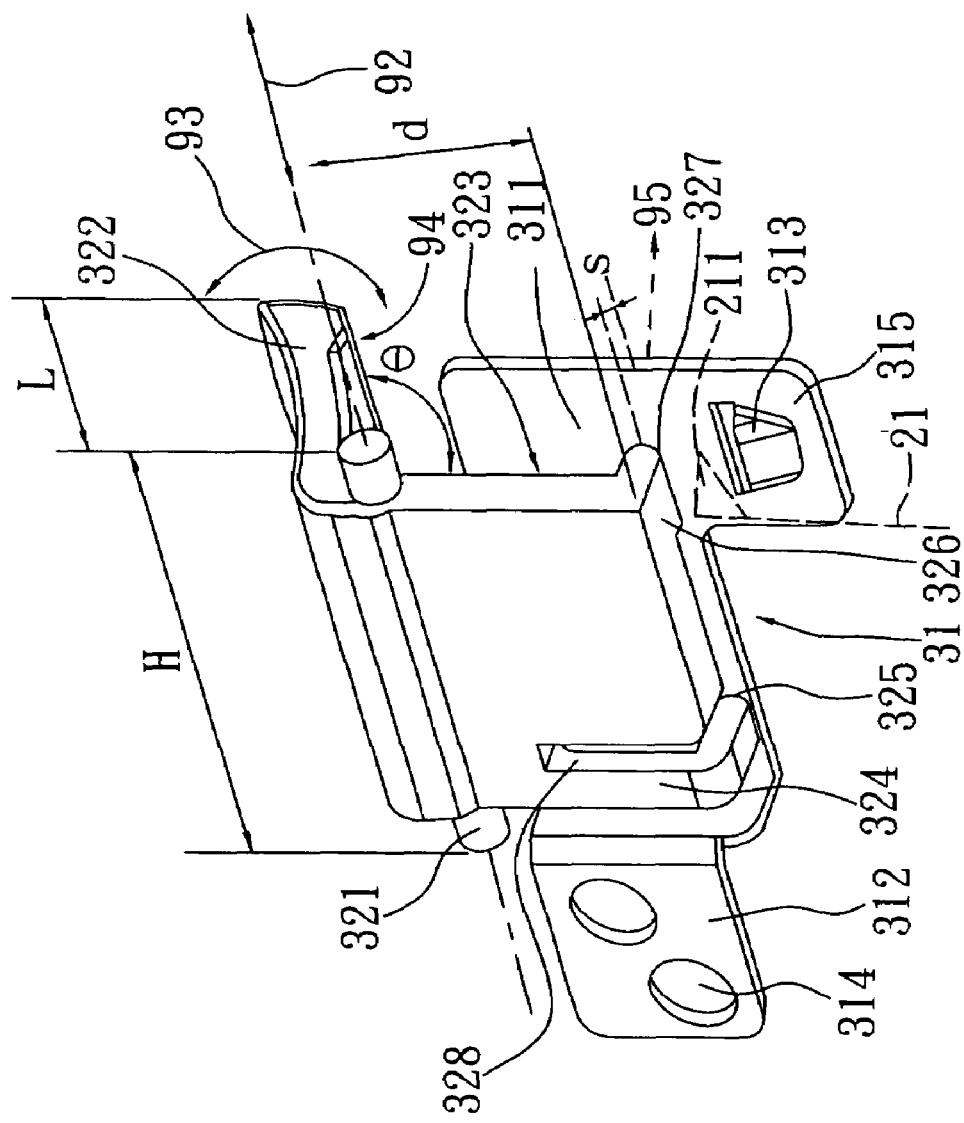
FIG. 3B is another perspective view of the rotary-releasing device for power supply according to the present invention.

Please refer to FIGS. 3A and 3B for the perspective views of the rotary-releasing device for power supply according to the present invention. The rotary-releasing-device 3 for a power supply comprises a latch bracket section 31 and a handle section 32. The latch bracket section 31 is a suspending arm assembly having a pressing surface 311, and a fixed end 312 of the latch bracket section 31 is connected to a free end selected from one of the two rotary arms 22. In the preferred embodiment of the present invention, the fixed end 312 has two holes 314 for receiving a screw bolt to connect with the free end 24. Of course, the fixed end 312 also can be soldered or riveted to the free end 24 for the connection. Such connecting methods are prior arts, and thus will not be described further hereinafter.

The handle section 32 further comprises an axle body 321, a lifting handle 322 and a pressing arm 323. The axle body 321 is extended to an appropriate height H along a direction 92, and such direction 92 can be extended to connect to the two rotary arms 22. In this embodiment, the axle body 321 is protruded from the handle section 32; or is a concave of the handle section 32 as well. Changes of this sort to the structure are prior arts and thus will not be described further hereinafter.

The lifting handle 322 is extended from the axle body 321 to an appropriate length L, which is capable of receiving a force to enable the handle section 32 to rotate about the extending direction 92 of the axle body axis to perform a rotating movement 93. The pressing arm 323 is extended from the axle body 321 to an appropriate distance d and connected to the lifting handle 322 at an appropriate angle θ, and the pressing arm 323 has a first contact body 324 and a second contact body 326, and further has an open groove 328 disposed between the first contact body 324 and the second contact body 326, such that the first contact body 324 and the second contact body 326 have independent flexible space for operating.

The latch bracket section 31 according to a preferred embodiment of the present invention further comprises a hook member 313 arranged at a free end 315 of the latch bracket section 31, and the lateral side 21 further comprises a connecting member 211 disposed at a position corresponding to the hook member 313. When the handle section 32 is at a first position 94, the side 325 of the top surface of the first contact body 324 presses against the pressing surface 311, and the side 327 of the top surface of the second contact body 326 is at an appropriate distance s away from the pressing surface 311, the hook member 313 and the connecting member 211 are interconnected with each other. Since the side 325 of the top surface of the first contact body 324 presses the pressing surface 311 to maintain the handle section 32 still. If a force is applied to the lifting handle 322 to set the handle section 32 to a second position 95, the side 327 of the top surface of the second contact body 326 presses against the pressing surface 311, and then the suspending arm structure of the latch bracket section 31 will separate the hook body 313, so that the hook member 313 and the connecting member 211 will be separated from each other. In this regard, such arrangement can separate the rotary-releasing device 3 from the power supply 2 by a rotating manner. In this embodiment, the side 325 of the top surface of the first contact body 324 and the side 327 of the top surface of the second contact body 326 are arc-shape surfaces and each forms a linear contact with the pressing surface 311. Of course, the contact bodies can be designed as a flat surface to form a two-dimensional contact with the pressing surface 311 as well.

Since the rotary-releasing device 3 for power supply according to the present invention moves by the rotary method, and provides a pre-stress to the handle to facilitates the access convenience and minimize the force required for installing/detaching the power supply. The present invention also achieves the effects of of keeping the handle still or resuming the handle to its initial position, which definitely can overcome the shortcomings of the prior arts, meet the industrial requirements, and enhances the competitiveness of the industry.

While the preferred embodiment of the invention has been set forth for the purpose of disclosure, modifications of the disclosed embodiment of the invention as well as other embodiments thereof may occur to those skilled in the art. For example, the quantity of fixed brackets is increased or decreased; and the shape of the positioning hole is changed, the shape of the positioning point is changed, etc. Accordingly, the appended claims are intended to cover all embodiments which do not depart from the spirit and scope of the invention.

What is claimed is:

1. A rotary-releasing device for power supply, comprising:
a latch bracket section, having a pressing surface, and said pressing surface having an end as a fixing end of a suspending arm assembly; and
a handle section, comprising:
  a rotary axle body, being extended to a predefined height along a direction;
  a lifting handle, being extended from said rotary axle body to a predefined length, capable of receiving a force to enable said handle section to perform a rotating movement using said direction as an axis; and
  a pressing arm, being extended from said rotary axle body to a predefined distance and connected to said lifting handle at a predefined angle, and said pressing arm furthering comprising an extending first contact body and an extending second contact body;
wherein a side of the top surface of said first contact body presses said pressing surface and a side of the top surface of said second contact body is a predefined distance away from said pressing surface while said handle section is at a first position; and a side of the top surface of said second contact body presses against said pressing surface while a force is being applied to said lifting handle to set said handle section at a second position.

2. The rotary-releasing device for power supply of claim 1, wherein said pressing arm further comprises an open groove disposed between said first and second contact bodies.

3. The rotary-releasing device for power supply of claim 1, wherein an end of said pressing surface opposite to the fixing end is a free end, and said free end has a hook member.

* * * * *